United States Patent
Deivasigamani et al.

(10) Patent No.: US 12,173,928 B2
(45) Date of Patent: Dec. 24, 2024

(54) OVERCURRENT PROTECTION DEVICE TRIP ALERT METHOD

(71) Applicant: Intellihot, Inc., Galesburg, IL (US)

(72) Inventors: Sridhar Deivasigamani, Mundelein, IL (US); Sivaprasad Akasam, Round Rock, TX (US)

(73) Assignee: Intellihot, Inc., Galesburg, IL (US)

( * ) Notice: Subject to any disclaimer, the term of this patent is extended or adjusted under 35 U.S.C. 154(b) by 32 days.

(21) Appl. No.: 18/199,257

(22) Filed: May 18, 2023

(65) Prior Publication Data

US 2024/0384895 A1    Nov. 21, 2024

(51) Int. Cl.
| | |
|---|---|
| G01R 19/15 | (2006.01) |
| F24H 15/144 | (2022.01) |
| F24H 15/395 | (2022.01) |
| G01R 21/00 | (2006.01) |
| H02H 3/08 | (2006.01) |

(52) U.S. Cl.
CPC ......... *F24H 15/395* (2022.01); *F24H 15/144* (2022.01); *G01R 21/00* (2013.01); *H02H 3/08* (2013.01)

(58) Field of Classification Search
USPC ............ 340/657, 660, 649, 641, 679, 686.1, 340/691.6, 693.1, 693.2, 693.3, 693.4, 340/3.43
See application file for complete search history.

(56) References Cited

U.S. PATENT DOCUMENTS

| | | | | |
|---|---|---|---|---|
| 4,871,914 A | * | 10/1989 | Simon | G01T 1/247 250/DIG. 2 |
| 6,885,568 B2 | * | 4/2005 | Kernahan | H05B 41/2828 363/97 |
| 2003/0018398 A1 | * | 1/2003 | Juntunen | G05B 19/042 700/24 |
| 2003/0213245 A1 | * | 11/2003 | Yates | F01K 17/02 60/671 |
| 2005/0125507 A1 | * | 6/2005 | Atias | H04L 12/10 709/224 |
| 2005/0255893 A1 | * | 11/2005 | Jin | H04W 52/0229 455/127.1 |
| 2010/0188245 A1 | * | 7/2010 | Nielsen | G01V 3/15 340/686.1 |
| 2010/0189887 A1 | * | 7/2010 | Nielsen | G01C 15/06 427/136 |
| 2014/0268973 A1 | * | 9/2014 | Connolly | G11C 5/04 365/63 |

* cited by examiner

*Primary Examiner* — Daniel Previl
(74) *Attorney, Agent, or Firm* — Jong Patent Firm; Cheng Ning Jong; Tracy P. Jong

(57) ABSTRACT

A method for detecting an insufficient power condition of a power supply to a system from a distinctive marker using a controller, the method including: upon a power-up of the system, determining an event associated with the distinctive marker; and periodically logging the distinctive marker in a non-volatile memory with respect to time, starting at the power-up of the device.

13 Claims, 3 Drawing Sheets

OVERCURRENT PROTECTION DEVICE TRIP ALERT METHOD

BACKGROUND OF THE INVENTION

1. The Field of the Invention

The present invention relates to a method for alerting an electrical supply user of a power-up problem of an electrical system. More specifically, the present invention is directed to a method for alerting an electrical supply user of an insufficiently provisioned overcurrent protection device.

2. Background Art

The overcurrent protection device rating of an electrical circuit is an important factor that affects what equipment can be installed on that circuit. The overcurrent protection device or simply circuit breaker or fuse rating is determined by the ampacity of the electrical wiring and the load requirements of the electrical devices that will be connected to the circuit. If the equipment's electrical load exceeds the fuse rating of the circuit, it can cause the fuse to blow or the circuit breaker to trip, which can lead to power outages, electrical hazards and damage to the equipment. As an example, if a circuit has a fuse rating of 15 A, it can safely handle electrical devices that have a total load of 15 amps or less. If an electrical device with a load of 20 amps is installed on that circuit, the circuit will overload, causing the fuse to blow or the circuit breaker to trip, interrupting power to that circuit. Therefore, it's essential to ensure that the electrical devices installed on a circuit do not exceed the fuse rating or ampacity of the circuit to avoid electrical hazards and ensure the safety of the building occupants.

The fuse ratings in a building refer to the maximum current rating of the fuses or circuit breakers installed in the electrical distribution system to protect the electrical wiring and appliances from overloading and short circuits. The fuse ratings depend on the capacity of the electrical service, the load demand and the wire size used in the building. In most residential and commercial buildings, the standard fuse or circuit breaker ratings range from 15 A to 100 A, with higher ratings for larger commercial or industrial buildings. The fuse or circuit breaker rating should be selected based on the ampacity of the electrical wire and the load requirements of the electrical devices connected to the circuit. It is important to consult with a licensed electrician to ensure that the proper fuse or circuit breaker ratings are selected to prevent electrical hazards and ensure the safety of the building occupants. A licensed electrician can help determine the appropriate fuse rating and ensure that the equipment installed is compatible with the electrical system in the building.

There are devices that can detect the lack of an adequate fuse for an alternating current (AC) power supply. These devices are known as "circuit protection devices" or "overcurrent protection devices." There are different types of overcurrent protection devices, including fuses, circuit breakers, and surge protectors. Fuses and circuit breakers are designed to interrupt the flow of current when there is an overcurrent condition, such as a short circuit or overload. If there is no fuse installed in the AC power supply circuit, the overcurrent protection device will not be able to function properly and it may fail to protect the circuit from damage. In this case, an electrical fault or overload could cause damage to the equipment or create a fire hazard. Therefore, it is important to ensure that all electrical circuits have the appropriate overcurrent protection devices, including fuses or circuit breakers, installed and functioning properly. Although an important part of an overcurrent protection scheme, an overcurrent protection device that is improperly sized can restrict operations of otherwise important, necessary and legitimate systems without providing an alert as to the reason for the shutdown of the system protected by it, leading to unnecessary shutdowns and downtime of the systems.

There exists a need for a mechanism for determining the root cause of the failure of a system to power-up due to a condition external to the system. There also exists a need for a mechanism for determining the root cause of the failure of a system to power-up due to an insufficiency in a power supply to the system.

SUMMARY OF THE INVENTION

In accordance with the present invention, there is provided a method for detecting an insufficient power condition of a power supply to a system using a controller, the method including:
(a) upon a power-up of the system, determining an event associated with the distinctive marker; and
(b) periodically logging the distinctive marker in a non-volatile memory with respect to time, starting at the power-up of the device.

In one embodiment, the method further includes communicating an alert associated with the event. In one embodiment, the distinctive marker is linked to a duration upon the power-up of the system. In one embodiment, the distinctive marker includes a count for every second that elapses from the power-up of the system. In one embodiment, the non-volatile memory can be an Electrically Erasable Programmable Read-Only Memory (EEPROM) or a flash memory. In one embodiment, the alert can be a message communicated to a visual information output device or a message communicated to an audio information output device or a combination thereof. In one embodiment, the visual information output device can be a mobile phone, a display screen of the system, a display screen functionally connected to the controller or any combinations thereof. In one embodiment, the audio information output device can be a mobile phone, an audio output device of the system, an audio output device functionally connected to the controller or any combinations thereof.

In accordance with the present invention, there is provided a method for controlling an operation of a system, the system including at least two subsystems disposed at a total power consumption including a first level of power consumption corresponding to a first of the at least two subsystems and a second level of power consumption corresponding to a second of the at least two subsystems, the method including:
(a) upon a power-up of the system, determining an event associated with a distinctive marker of the system, wherein if said event indicates a system shutdown due to the total power consumption exceeding an allowable power level of a power source, restricting activations of the at least two subsystems to a level under the total power consumption; and
(b) communicating an alert indicating the system operates at a level less than its total capability due to a power limitation.

In one embodiment, the method further includes periodically logging the distinctive marker in a non-volatile memory with respect to time, starting at the power-up of the system. In one embodiment, the method further includes communicating an alert associated with the event.

An object of the present invention is to provide a mechanism for detecting the root cause of a failure for a system to power-up.

Another object of the present invention is to provide a mechanism for most expeditiously detecting the root cause of a failure for a system to power-up by minimizing the number of power-up attempts required to determine the root cause.

Whereas there may be many embodiments of the present invention, each embodiment may meet one or more of the foregoing recited objects in any combination. It is not intended that each embodiment will necessarily meet each objective. Thus, having broadly outlined the more important features of the present invention in order that the detailed description thereof may be better understood, and that the present contribution to the art may be better appreciated, there are, of course, additional features of the present invention that will be described herein and will form a part of the subject matter of this specification.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

PARTS LIST

Figure 1:
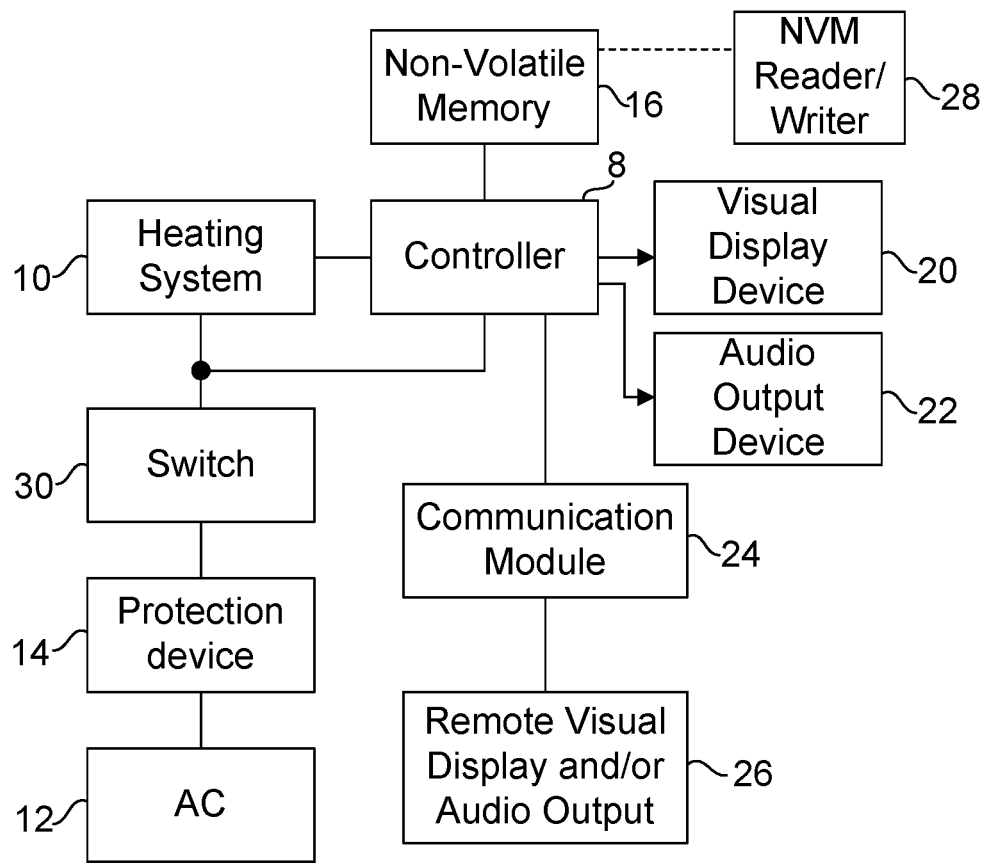
FIG. 1 is a diagram depicting a circuit breaker trip alert system.

2—step of powering up of device
4—step of determining an event associated with the distinctive marker
6—step of periodically logging distinctive marker in a non-volatile memory with respect to time
8—controller
10—system, e.g., heating system
12—alternating current (AC) power
14—overcurrent protection device, e.g., circuit breaker, fuse
16—non-volatile memory, e.g., Electrically Erasable Programmable Read-Only Memory (EEPROM)
18—memory location
20—visual display device
22—audio output
24—communication module
26—remote visual display and/or audio output
28—memory reader/writer
30—switch
32—step of communicating alert associated with event Particular Advantages of the Invention The present method provides a means for informing a user of the root cause of the failure of a system to power-up due to an insufficiency in the circuit breaker that prevents a larger current to be drawn to power the system such that the problem can be corrected.

As the present mechanism for detecting the cause of a failure for a system to power-up is based on a measure of elapsed time until the controller responsible for the mechanism is no longer supplied with power, the present mechanism can pinpoint the root cause for a failure for a system to power-up accurately.

The present method enables confirmation that a fix for the insufficiency in a circuit breaker works by observing a proper power-up of the system, without getting shut down due to an inadequate circuit breaker. As the confirmation is simple and done as a matter of course, this procedure can be guaranteed to occur in every installation of the system in which the method is performed.

DETAILED DESCRIPTION OF A PREFERRED EMBODIMENT

The term "about" is used herein to mean approximately, roughly, around, or in the region of. When the term "about" is used in conjunction with a numerical range, it modifies that range by extending the boundaries above and below the numerical values set forth. In general, the term "about" is used herein to modify a numerical value above and below the stated value by a variance of 20 percent up or down (higher or lower).

In a planned new installation of equipment, e.g., a water heating system, the deployment of the new equipment is often preceded with a careful study of the impact the equipment has on its surroundings and the required power sources to run the equipment. If a power supply is deemed insufficient, proper upgrades to the power supply must be made prior to the installation of the new equipment or the new equipment may not function properly. For instance, if a 3-phase power is required, care must be taken to ensure that this type of power supply is provided prior to installation. If the current draw for the new equipment exceeds the existing capacity, as limited by a circuit breaker, a proper circuit breaker having an increased capacity rating must be provided. However, even with the best intentions, there is no guarantee that the needed overcurrent protection device will necessarily be installed even when one has been identified. Upon installation, the new equipment is typically commissioned, weeding out major problems associated with the proper functioning of the new equipment. During commissioning of the new equipment, engineering techniques and procedures may be applied to check, inspect and test most if not all operational components of the new equipment. However, not all new equipment is installed according these strict protocols, especially when the new equipment are provided as an upgrade or an increased service capacity that is performed at a later time to an initial installation of the new equipment. When a system fails to power-up, there could be a myriad of potential causes, some of which may be associated with the system itself while others may be caused by the incompatibility of the environments to which the systems are connected. Therefore, it would be beneficial for a failure of a system to power-up to be identified soon after it occurs such that it can be addressed immediately or while an installation personnel is still around at the installation site to complete the installation of the system properly.

FIG. 1 is a diagram depicting a circuit breaker trip alert system where an involuntary disconnection of a power supply to the controller can be detected. The system includes a controller 8 and a plurality of devices or services functionally connected to it. In the embodiment shown, the controller 8 includes a non-volatile memory 16, e.g., an Electrically Erasable Programmable Read-Only Memory (EEPROM). A switch 30 is disposed in a manner to control whether the heating system 10 and the controller receives power, e.g., from an alternating current (AC) power source 12 or a power source subsequently modified from the AC power source to suit the system 10 and/or the controller 8, e.g., a direct current (DC) power source. The EEPROM is typically a built-in service useful for holding parameters needed in the boot-up of the controller. There may be available space in the EEPROM for holding a time-dependent parameter for use with the present method disclosed elsewhere herein. In another embodiment, a flash memory, if available, may be used instead although the use of flash may be less desirable as the time-dependent data is written at every power-up of the system, i.e., when the system receives power from an unpowered state, e.g., when the switch 30 is disposed in the on state from its off state. Flash memory can be programmed and erased in blocks, while EEPROM can be programmed and erased byte-by-byte. This makes EEPROM more flexible for applications that require frequent changes in small amounts of data, while flash memory is more often used for applications that require infrequent changes in large amounts of data. An overcurrent protection device 14, e.g., a circuit breaker or a fuse is used to protect against overcurrents and electrical faults. A circuit breaker operates by tripping a switch when the current exceeds a certain level, breaking the circuit and interrupting the flow of current. A fuse, on the other hand, operates by melting a wire or element inside the fuse when the current exceeds a certain level, thus interrupting the flow of current in the circuit. Circuit breakers can generally handle a larger current capacity than fuses and are often used in applications where high fault currents are expected. A fuse is a one-time-use device, and once it has melted and interrupted the circuit, it must be replaced. A circuit breaker, on the other hand, can be reset by flipping the switch back to its original position after the fault has been corrected although, once identified, the circuit breaker with a higher ampacity rating will be required once an insufficiency in the circuit breaker has been identified. Fuses are often used in low-voltage applications, while circuit breakers are commonly used in higher voltage applications. A memory reader/writer 28, often available as a part of the services of the controller 8 can be used to access, e.g., read from or write to the non-volatile memory 16. As disclosed elsewhere herein, the string or value held in the non-volatile memory 16 is useful for determining the root cause of a power-up fault of the system, e.g., heating system 10 connected to the same power source 12 as the controller 8. The controller 8 need not be a dedicated controller but rather the same controller already configured for use in controlling the heating system 10. As the present method for detecting an insufficient power condition of a power supply to a system is a time-dependent system as disclosed elsewhere herein, a timer function is also available in the controller such that a time counter can be implemented. Although the contents of the non-volatile memory can be accessed locally and manually, a fault condition due to an insufficient power condition of a power supply to a system cannot be discovered expeditiously or easily without a notification system. In the embodiment shown, a locally available visual display device 20 and an audio output device 22 may be functionally connected to controller 8 such that a message indicating an insufficient power condition of a power supply to a system can be conveyed to a user via the visual display device 20 and the audio output device 22. For a more comprehensive reach to a user, the message can be alternatively or additionally conveyed by way of a communication module 24 that is functionally connected to the controller 8, to a remote visual display and/or audio output, e.g., those available on a mobile device, e.g., a mobile phone and/or an electronic pad, via the internet.

Figure 2:
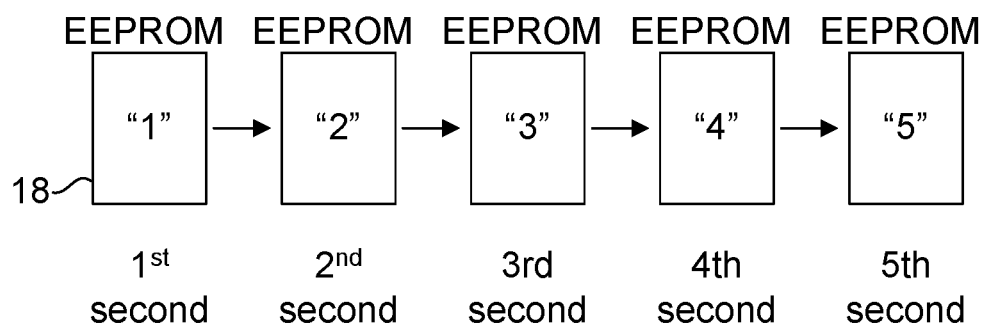
FIG. 2 is a diagram depicting a mechanism of a circuit breaker trip alert system useful for retaining records prior to a circuit trip.

FIG. 2 is a diagram depicting a mechanism of a circuit breaker trip alert system useful for retaining records prior to a circuit trip. Here, a time-lapse content of a memory location 18 of a non-volatile memory is shown to hold a marker or content which can be deciphered at a later time. In this example, a marker is shown written to this EEPROM location 18 starting from marker "1" to marker "5," with each marker representing the amount of time in seconds that the controller 8 of FIG. 1 has been powered. A timer of the controller 8 of FIG. 1 is used for time tracking. For instance, upon powering up for 1 second, a marker "1" is written by the EEPROM writer to the EEPROM location 18. Here, the highest marker written to the location is "5," meaning the controller 8 of FIG. 1 has been powering up for at least about 5 seconds before the power source to the controller 8 of FIG. 1 is removed as the power source has been isolated by a circuit breaker which trips. When a circuit breaker trips, there is a tendency for a user to simply replace the tripped circuit breaker with one which has a significantly higher rating. However, if not selected based on the need for the requirement at hand, a circuit breaker with an overly large ampacity can cause the system and/or controller to be damaged if the circuit breaker does not have a rating that allows the necessary current draw of the system 10 of FIG. 1 while limiting an inadvertent, excessively large current draw.

Figure 3:
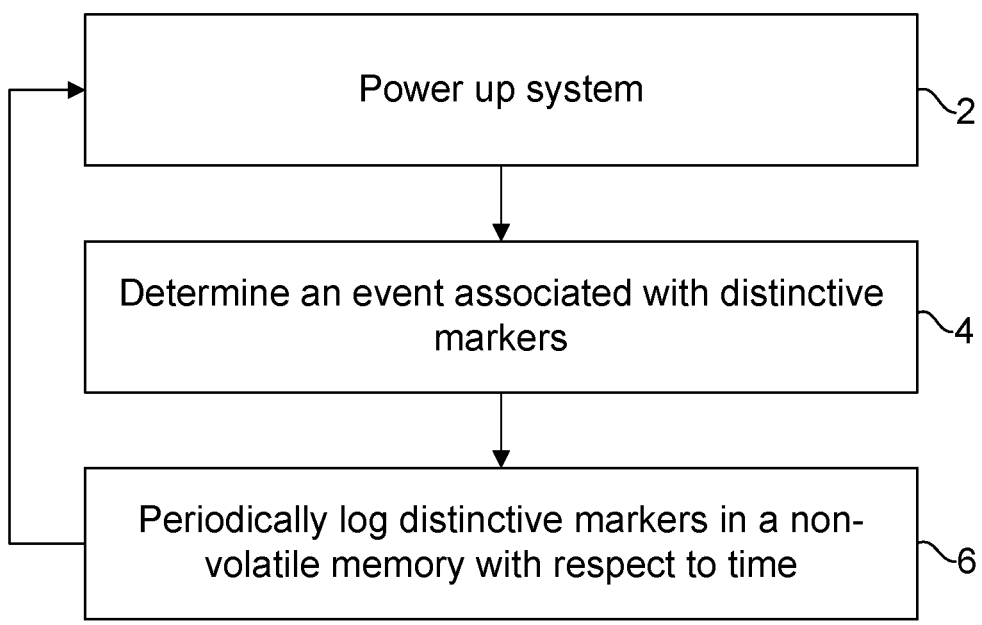
FIG. 3 is a diagram depicting a method for detecting a circuit breaker trip.

FIG. 3 is a diagram depicting a method for detecting a circuit breaker trip. Upon making connections, e.g., those shown in FIG. 1, the system 10 is ready to be powered up as shown in step 2 by disposing the switch 30 of FIG. 1 in the on position. The controller 8 is then configured to access the non-volatile memory 16 for a distinctive marker stored in it. The marker is considered distinctive because although the controller can be preprogrammed to write time lapse data to it, every system and its environment may differ slightly and therefore, the time lapse data may also show some variability. All the ensuing activities for determining a fault event based on a distinctive marker stored in the non-volatile memory 16 must be performed as soon as possible, i.e., preferably within the first few seconds of the power-up of the system 10 as the failure to power-up is punctuated with a disconnection of power to the system 10 and the controller 2 at which point any power-up activities directed by the controller 8 will cease. Although the activities to cause a circuit breaker trip can be programmed, it is in the user's best interest if a fault that prevents the full functioning of the system can be discovered as soon as possible. Therefore, such activities shall be queued up in the period when the system powers up. In one embodiment, the discovery of a power-up fault can simply be ascertained by accessing the data store in the non-volatile memory 16 and looking up the meaning of the fault or marker as shown in step 4 by probing the EEPROM location 18 manually. However, this is inconvenient for the technician as it would require that the controller 8 be powered separately for the non-volatile memory 16 connected to it to be readable using an external tool. In the example shown in FIG. 2, in the particular setup, a circuit breaker was used and the overcurrent protection device to prevent an overcurrent to a circuit it protects is initially rated at 20 A. In one example, the system is a heating system including a heat pump and two heating, e.g., resistive elements. The heat pump is rated at 240 V 3.5 KW while each of the resistive elements is rated at 240V 6 KW. Upon turning on the switch 30, the controller receives power to start powering up. As the new equipment now requires a 14.58 A in current draw to run the heat pump, the existing 20 A circuit breaker is sufficient as the required current draw is within this limit, therefore allowing the heat pump to continue to operate. The EEPROM is accessed at power-up such that a previously recorded insufficient power issue can be identified. The identification of any previously occurred fault/s shall be done as soon as possible or before an activation of a subsystem which can cause the power supply to the system to shut down. With each second that elapsed, the controller causes a marker to be written to the non-volatile memory. For instance, after a first full second elapsed, a string or number "1" is written to the EEPROM. The factory setting for the content of the EEPROM is "0." The controller relies on its timer to track the time at which the content of EEPROM location 18 is to be updated. After a second full second has elapsed, a string or number "2" is written to the EEPROM. This process as shown in step 6 continues until the power to the controller 8 ceases to exist after writing a "5," i.e., before the controller 8 managed to cause a "6" to be written to the EEPROM. At the $5^{th}$ second mark from power-up, one of the resistive elements of 240 V 6 KW is activated. The total current draw is now disposed at 39.58 A from a combined total of 240 V 9.5 KW device, a current draw that is far exceeding the ampacity of the 20 A of the circuit breaker. At this combined power consumption of the heat pump and one resistive element, the current draw is now exceeding the rated overcurrent protection of the circuit breaker. A circuit breaker rated at least for 40 A is required. Therefore, for the newly-installed equipment, if the EEPROM content is no longer "0," it can be said that a power-up attempt has taken place as the factory setting is no longer the case. If the EEPROM content is no longer "0" and does not exceed "5," it can be said that a power-up attempt has taken place but the power-up process did not succeed and that a circuit breaker rated at least at 40 A is required. To ensure that a 40 A circuit breaker is suitable, the relevant circuit breaker is upgraded to a 40 A circuit breaker and a new power-up is effected. If the EEPROM is found to hold a string having a value greater than "5," the power-up with the activations of the heat pump and one resistive element has succeeded. However, a circuit breaker rated for 40 A is still insufficient for a second resistive element which adds another 6 kW to the total power consumption.

During normal operations of the system, it is possible that the heat pump and both the resistive elements may be turned on simultaneously to meet a heating demand. In verifying whether or not the circuit breaker is suitable for the second resistive element to be added to the total power consumption, the EEPROM continues to be updated once every second with a string representing the elapsed time in seconds. At the $60^{th}$ second mark, the second resistive element is activated. Again, if the system fails to continue to be powered to the $61^{st}$ second, this means that the circuit breaker has tripped and the circuit breaker is unsuitable for the current draw exerted by the heat pump along with the first resistive element and the second resistive element. This can be confirmed by again resetting the circuit breaker and then powering up the system. The EEPROM should hold a string of "60" as the second resistive element or the increased current load was exerted at the $60^{th}$ second. In each of the examples, it is possible for the tripping of a circuit breaker to be delayed. Therefore, when the expected string is "5," the actual string may be "6" and when the expected string is "60," the actual string may be "61." It can now be seen that the marker or the content of the EEPROM is linked to a duration upon the power-up of the system. As disclosed elsewhere herein, the marker is distinctive because it includes a count for every second that elapses from the power-up of the system which can indicate not only a specific event but also the response time of the overcurrent protection device of the system is connected to. In one embodiment, not shown, the availability of one or both of the resistive elements is selectable via a display. For instance, if the overcurrent protection device is unsuitable for the use of all subsystems of the system, a user may define which subsystem/s may be activated to avoid an inadvertent shutdown of the power supply due to insufficient ampacity of the overcurrent protection device. The controller can be programmed to cease writing to the EEPROM once a detection period has expired. In this case, once a timer indicates 62 seconds have elapsed from the power-up of the system, it would be safe to assume that any ensuing power-related faults would not be related to the overcurrent protection of the circuit involving the system. Armed with the information stored in the EEPROM, the system may be programmed to power-up in a "limp-along" mode until such time an insufficient overcurrent protection device has been corrected. For instance, upon receiving an indication of an overcurrent protection fault, upon a reset of a circuit breaker resulting in the overcurrent protection fault and upon re-powering of the system and upon determining the type of fault the system experienced in the last power-up, the system can be programmed to only utilize the subsystem/s that draw a current under the allotted ampacity for the overcurrent protection device. It shall be noted that the present method for detecting a failure in the power-up of a system that is caused by an overcurrent protection device, is not only useful for identifying an overcurrent protection device that is undersized, but it also allows the process of fine-tuning the requirement for an appropriate overcurrent protection device, i.e., one which enables the functioning of the system but yet not overly-sized to cause ineffective protection of the system from overcurrent. Although, the power draw requirements can be calculated during the design and build of a system, the actual power draw in the field may be different as there can be additional auxiliary devices or systems that are connected to the same circuit as the core system of a circuit in a field application. However, the present method allows for the suitability of an overcurrent protection device to be progressively tested by using a circuit breaker with a progressively larger rating to ensure that if a damaging overcurrent event does occur in the future that the circuit breaker functions according to its intended purpose, i.e., to isolate the system and any additional devices connected to it from a large damaging current. The activation of the first resistive element need not occur at the $5^{th}$ second from power-up and the activation of the second resistive element need not occur at the $60^{th}$ second from power-up. However, it is important for the controller to confidently correlate the effect of activating a subsystem with a trip in the circuit breaker, i.e., the time at which the subsystem is activated is tied chronologically with the occurrence of a shutdown of the system.

Figure 4:
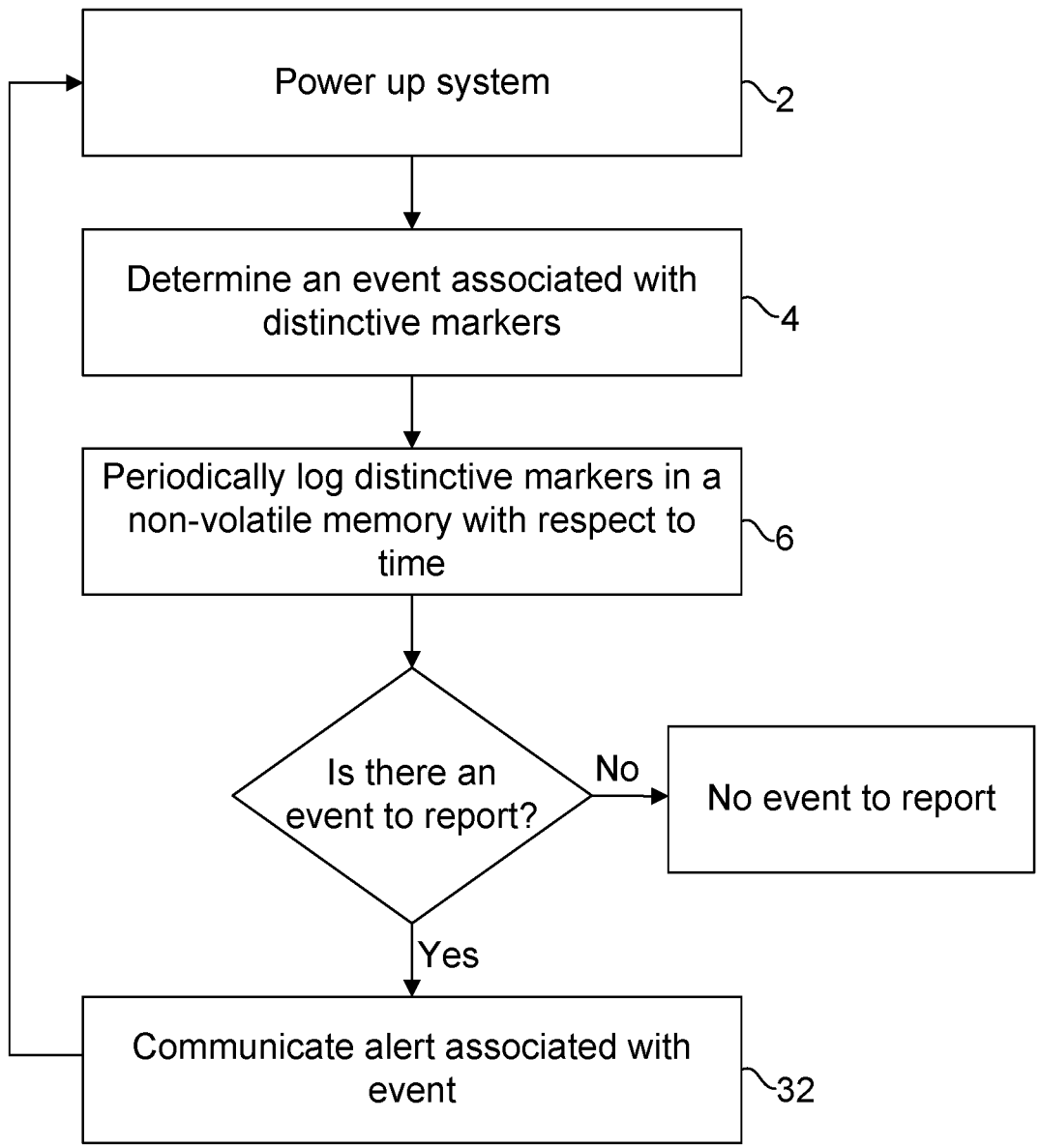
FIG. 4 is a diagram depicting a method for detecting and reporting a circuit breaker trip.

FIG. 4 is a diagram depicting a method for detecting and reporting a circuit breaker trip. Here, the method further includes communicating an alert associated with an overcurrent protection fault to a user as shown in step 32 such that the information can be timely passed to the user for it can be acted upon in a timely manner. An alert or message indicating that the system is currently operating at a power level less than its total capability due to a power limitation can also be raised at the same time during the display of a message drawing a user's attention to the overcurrent protection fault. Referring to both FIGS. 1 and 4, the alert can be a message communicated to a visual information output device 20 or a message communicated to an audio information output device 22 or a combination thereof. The visual information output device 20 can be, but not limited to, a mobile phone, a display screen of the system, a display screen functionally connected to the controller or any combinations thereof. The audio information output device 22 can be, but not limited to, a mobile phone, an audio output device of the system, an audio output device functionally connected to the controller or any combinations thereof.

The detailed description refers to the accompanying drawings that show, by way of illustration, specific aspects and embodiments in which the present disclosed embodiments may be practiced. These embodiments are described in sufficient detail to enable those skilled in the art to practice aspects of the present invention. Other embodiments may be utilized, and changes may be made without departing from the scope of the disclosed embodiments. The various embodiments can be combined with one or more other embodiments to form new embodiments. The detailed description is, therefore, not to be taken in a limiting sense, and the scope of the present invention is defined only by the appended claims, with the full scope of equivalents to which they may be entitled. It will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present disclosed embodiments includes any other applications in which embodiments of the above structures and fabrication methods are used. The scope of the embodiments should be determined with reference to the appended claims, along with the full scope of equivalents to which such claims are entitled.

What is claimed herein is:

1. A method for detecting an insufficient power condition of a power supply to a system using a controller, said method comprising:
    (a) during a power-up of the system, accessing a distinctive marker stored in a non-volatile memory of the controller and determining an event associated with the distinctive marker in the non-volatile memory, the distinctive marker is a value corresponding to a duration upon a prior power-up of the system wherein if said event indicates the occurrence of a system shutdown due to a total power consumption of the system exceeding an allowable power level of a power source prior to the power-up of the system, restricting activations of the system to a power level under the total power consumption; and
    (b) periodically logging the distinctive marker in the non-volatile memory with a value corresponding to a duration upon the power-up of the system, starting at said power-up of the system after accessing the distinctive marker during the power-up of the system.

2. The method of claim 1, further comprising communicating an alert associated with said event.

3. The method of claim 2, wherein said alert comprises a message selected from the group consisting of a message communicated to a visual information output device and a message communicated to an audio information output device and a combination thereof.

4. The method of claim 3, wherein said visual information output device is a device selected from the group consisting of a mobile phone, a display screen of the system, a display screen functionally connected to the controller and any combinations thereof.

5. The method of claim 3, wherein said audio information output device is a device selected from the group consisting of a mobile phone, an audio output device of the system, an audio output device functionally connected to the controller and any combinations thereof.

6. The method of claim 1, wherein the distinctive marker comprises a count for every second that elapses from said power-up of the system.

7. The method of claim 1, wherein said non-volatile memory is a memory selected from the group consisting of an Electrically Erasable Programmable Read-Only Memory (EEPROM) and a flash memory.

8. The method of claim 1, wherein the system comprises a heat pump and a resistive heating element.

9. A method for controlling an operation of a system, the system comprising at least two subsystems disposed at a total power consumption comprising a first level of power consumption corresponding to a first of said at least two subsystems and a second level of power consumption corresponding to a second of said at least two subsystems, said method comprising:
    (a) during a power-up of the system, accessing a distinctive marker stored in a non-volatile memory and determining an event associated with the distinctive marker in the non-volatile memory, the distinctive marker is a value corresponding to a duration upon a prior power-up of the system, wherein if said event indicates the occurrence of a system shutdown due to the total power consumption exceeding an allowable power level of a power source prior to the power-up of the system, restricting activations of the at least two subsystems to a power level under the total power consumption; and
    (b) communicating an alert indicating the system operates at a level less than its total capability due to a power limitation.

10. The method of claim 9, further comprising periodically logging the distinctive marker in a non-volatile memory with respect to time, starting at said power-up of the system.

11. The method of claim 10, wherein said non-volatile memory is a memory selected from the group consisting of an Electrically Erasable Programmable Read-Only Memory (EEPROM) and a flash memory.

12. The method of claim 9, wherein said distinctive marker comprises a count for every second that elapses from said power-up of the system.

13. The method of claim 9, wherein said at least two subsystems comprise a heat pump and a resistive heating element.

\* \* \* \* \*